(12) United States Patent
Inukai et al.

(10) Patent No.: US 10,701,323 B2
(45) Date of Patent: Jun. 30, 2020

(54) IMAGE DISPLAY SYSTEM, MOVABLE OBJECT, AND IMAGE DISPLAY METHOD

(71) Applicant: PANASONIC INTELLECTUAL PROPERTY MANAGEMENT CO., LTD., Osaka (JP)

(72) Inventors: Fumihito Inukai, Kyoto (JP); Kosuke Kubota, Osaka (JP); Yukihiro Chokyu, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/363,580

(22) Filed: Mar. 25, 2019

(65) Prior Publication Data

US 2019/0306475 A1 Oct. 3, 2019

(30) Foreign Application Priority Data

Mar. 29, 2018 (JP) .................. 2018-066196

(51) Int. Cl.
*G06F 3/038* (2013.01)
*G09G 5/00* (2006.01)
*H04N 9/31* (2006.01)
*H03M 1/66* (2006.01)

(52) U.S. Cl.
CPC ............ *H04N 9/3135* (2013.01); *H03M 1/66* (2013.01); *H04N 9/3155* (2013.01); *H04N 9/3179* (2013.01); *G09G 2310/0264* (2013.01)

(58) Field of Classification Search
CPC . G02B 27/01; G09G 2310/0264; H03M 1/66; H04N 9/3129; H04N 9/3135; H04N 9/3155; H04N 9/3164; H04N 9/3179
See application file for complete search history.

(56) References Cited

U.S. PATENT DOCUMENTS

| 1,034,901 | A1 | 7/2019 | Hatagi et al. |
| 2009/0244407 | A1 | 10/2009 | Sakakibara |
| 2013/0241971 | A1 | 9/2013 | Sekiya et al. |
| 2017/0280115 | A1 | 9/2017 | Hatagi et al. |

FOREIGN PATENT DOCUMENTS

| JP | 2004-112183 | 4/2004 |
| JP | 2008-103511 | 5/2008 |
| JP | 2009-244797 | 10/2009 |
| JP | 2012-108397 | 6/2012 |
| JP | 2017-173715 | 9/2017 |

*Primary Examiner* — Insa Sadio
(74) *Attorney, Agent, or Firm* — Greenblum & Bernstein, P.L.C.

(57) ABSTRACT

The image display system includes a processing unit and a driving unit. The processing unit is configured to receive an image signal indicative of an instruction value of luminance of a light source. The driving unit is configured to supply a drive current to the light source in accordance with the instruction value indicated by the image signal received by the processing unit. The driving unit includes a shaping circuit and an adjusting unit. The shaping circuit includes a plurality of D/A converters and an arithmetic unit. The arithmetic unit is configured to output the drive current to the light source based on a computation result of analog signals outputted from the plurality of D/A converters. The adjusting unit is configured to determine values of digital signals inputted into the plurality of D/A converters of the shaping circuit in accordance with the instruction value.

20 Claims, 8 Drawing Sheets

IMAGE DISPLAY SYSTEM, MOVABLE OBJECT, AND IMAGE DISPLAY METHOD

CROSS-REFERENCE TO RELATED APPLICATION

The present application is based upon and claims the benefit of priority of Japanese Patent Application No. 2018-066196, filed on Mar. 29, 2018.

TECHNICAL FIELD

The present disclosure generally relates to image display systems, movable objects, and image display methods. The present disclosure particularly relates to an image display system for displaying an image by use of light from a light source, a movable object including the image display system, and an image display system for displaying an image by use of light from a light source.

BACKGROUND ART

JP 2009-244797 A discloses an image display device (image display system). The image display device of JP 2009-244797 A includes a picture signal supply circuit for generating individual signals used as components for synthesizing a picture based on an image signal inputted from external equipment. Additionally, the image display device includes: a control unit for controlling the picture signal supply circuit to adjust intensity of light outputted from a light source and/or the like; an R laser driver; a G laser driver; and a B laser driver. The individual laser drivers drive the light source unit based on respective red, green, and blue picture signals transferred as picture signals from the picture signal supply circuit, so that the light source unit outputs individual intensity-modified laser beams with individual colors. The light source includes an R laser for outputting a red laser beam, a G laser for outputting a green laser beam, and a B laser for outputting a blue laser beam.

Light sources such as lasers have properties in which an amount of light (luminance) increases rapidly in response to supply of a drive current exceeding a unique threshold current value. Therefore, in some cases, luminance changes drastically when the drive current is increased in accordance with the picture signal (an instruction value of luminance indicated by the image signal). This may cause decrease in reproducibility.

An object would be to propose an image display system, a movable object, and an image display method capable of adjusting change in actual luminance relative to change in an instruction value of luminance.

SUMMARY

An image display system according to one embodiment of the present disclosure is an image display system for forming an image by use of light from a light source of a luminaire, and includes a processing unit and a driving unit. The processing unit is configured to receive an image signal indicative of an instruction value of luminance of the light source. The driving unit is configured to supply a drive current to the light source in accordance with the instruction value indicated by the image signal received by the processing unit. The driving unit includes a shaping circuit and an adjusting unit. The shaping circuit includes a plurality of D/A converters and an arithmetic unit. The plurality of D/A converters are each configured to, in response to input of a digital signal, output an analog signal corresponding to a value of the digital signal. The arithmetic unit is configured to output the drive current to the light source based on a computation result of the analog signals outputted from the plurality of D/A converters. The adjusting unit is configured to determine the values of the digital signals inputted into the plurality of D/A converters of the shaping circuit in accordance with the instruction value.

A movable object according to one embodiment of the present disclosure includes the image display system, and a body where the image display system is installed.

An image display method according to one embodiment of the present disclosure is an image display method for forming an image by use of light from a light source of a luminaire, and includes: receiving an image signal indicative of an instruction value of luminance of the light source; determining values of digital signals inputted into a plurality of D/A converters in accordance with the instruction value; and outputting the drive current to the light source based on a computation result of analog signals outputted from the plurality of D/A converters.

DETAILED DESCRIPTION

1. Embodiments 1.1 Overview

Figure 1:
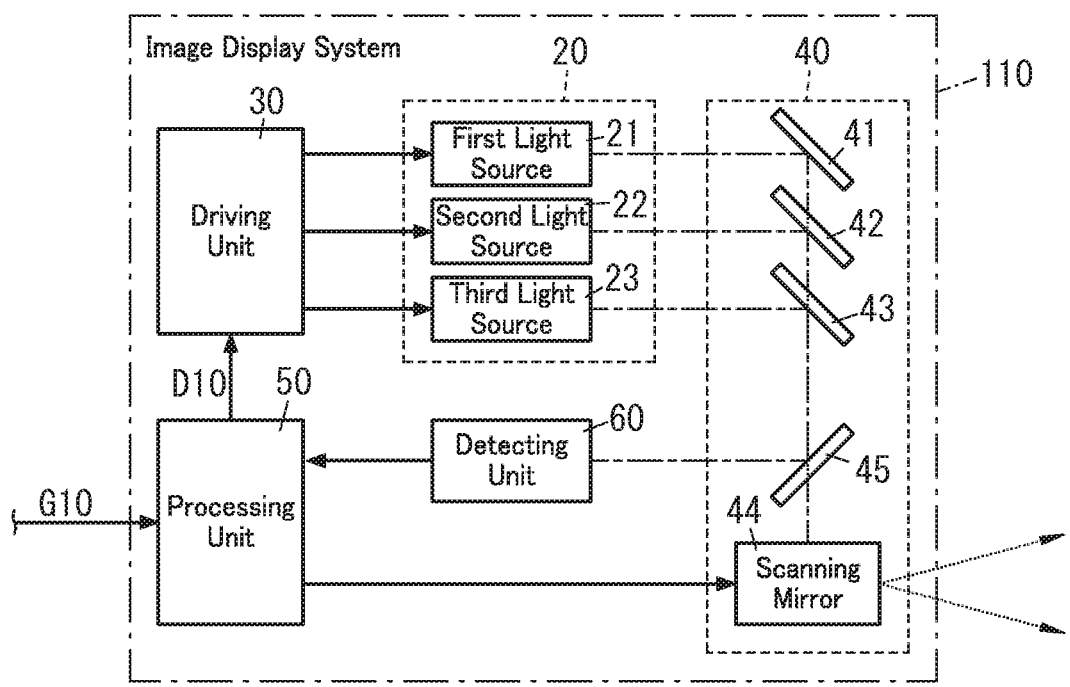
FIG. 1 is a block diagram of an image display system of one embodiment.

FIG. 1 shows an image display system 110 of one embodiment. The image display system 110 is for forming an image by use of light from a light source 21 to 23 of a luminaire 20, and includes a processing unit 50 and a driving unit 30. The processing unit 50 is configured to receive an image signal G10 indicative of an instruction value of luminance of the light source 21 to 23. The driving unit 30 is configured to supply a drive current to the light source 21 to 23 in accordance with the instruction value indicated by the image signal G10 received by the processing unit 50. The driving unit 30 includes a shaping circuit 31 and an adjusting unit 32. The shaping circuit 31 includes a plurality of D/A converters 341 and 342 and an arithmetic unit 35. The plurality of D/A converters 341 and 342 are each configured to, in response to input of a digital signal, output an analog signal corresponding to a value of the digital signal. The arithmetic unit 35 is configured to output the drive current to the light source 21 to 23 based on a computation result of the analog signals outputted from the plurality of D/A converters 341 and 342. The adjusting unit 32 is configured to determine the values of the digital signals inputted into the plurality of D/A converters 341 and 342 of the shaping circuit 31 in accordance with the instruction value.

As described above, the image display system 110 outputs the drive current to the light source 21 to 23 based on the computation result of the analog signals outputted from the plurality of D/A converters 341 and 342. In the image display system 110, the adjusting unit 32 determines values of digital signals inputted into the plurality of D/A converters 341 and 342 of the shaping circuit 31 in accordance with the instruction value of luminance of the light source 21 to 23 indicated by the image signal G10. Accordingly, the image display system 110 is capable of adjusting change in actual luminance of the light source 21 to 23 relative to change in the instruction value of luminance of the light source 21 to 23. Especially, according to such adjustment, a relation between change in the luminance of the light source and change in the instruction value of the luminance of the image signal G10 can be made to come close to a linear relationship. Consequently, improvement of reproducibility of an image can be expected.

1.2 Configuration

Figure 3:
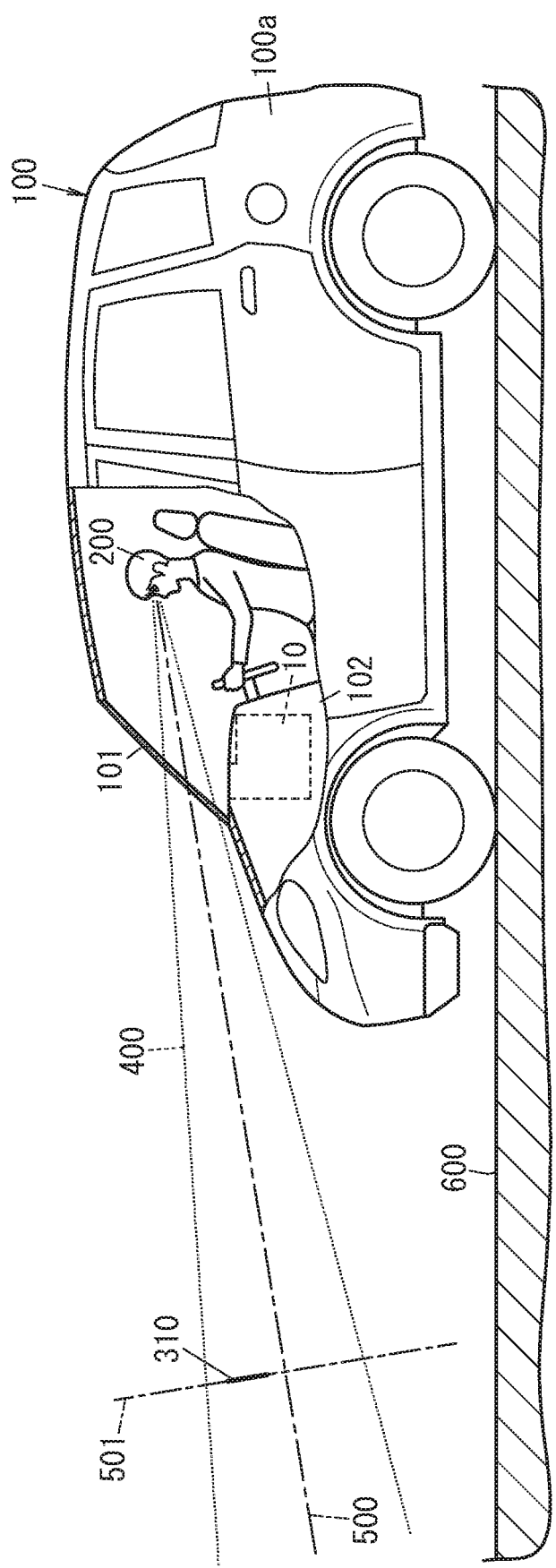
FIG. 3 is a conceptual view of a movable object (automobile) including the above image display system.

Hereinafter, the image display system 110 is described in detail. As shown in FIG. 3, the image display system 110 is used in a display system 10 installed in an automotive body (body) 100a of an automobile (movable body) 100, for example. The display system 10 is a head-up display (HUD), for example. The display system 10 is installed in an interior of the automobile 100 to project an image onto a wind shield 101 of the automotive body 100a of the automobile 100 from below. In FIG. 3, the display system 10 is placed inside a dashboard 102 below the wind shield 101. When an image is projected from the display system 10 onto the wind shield 101, the image reflected from the wind shield 101 serving as a reflective member may be visually perceived by a user 200 (driver). Obviously, the automobile 100 (movable object) includes the display system 10 and the reflective member (in this regard, the window shield 101). The reflective member is light-transmissive and reflects light emitted from the display system 10.

Figure 4:
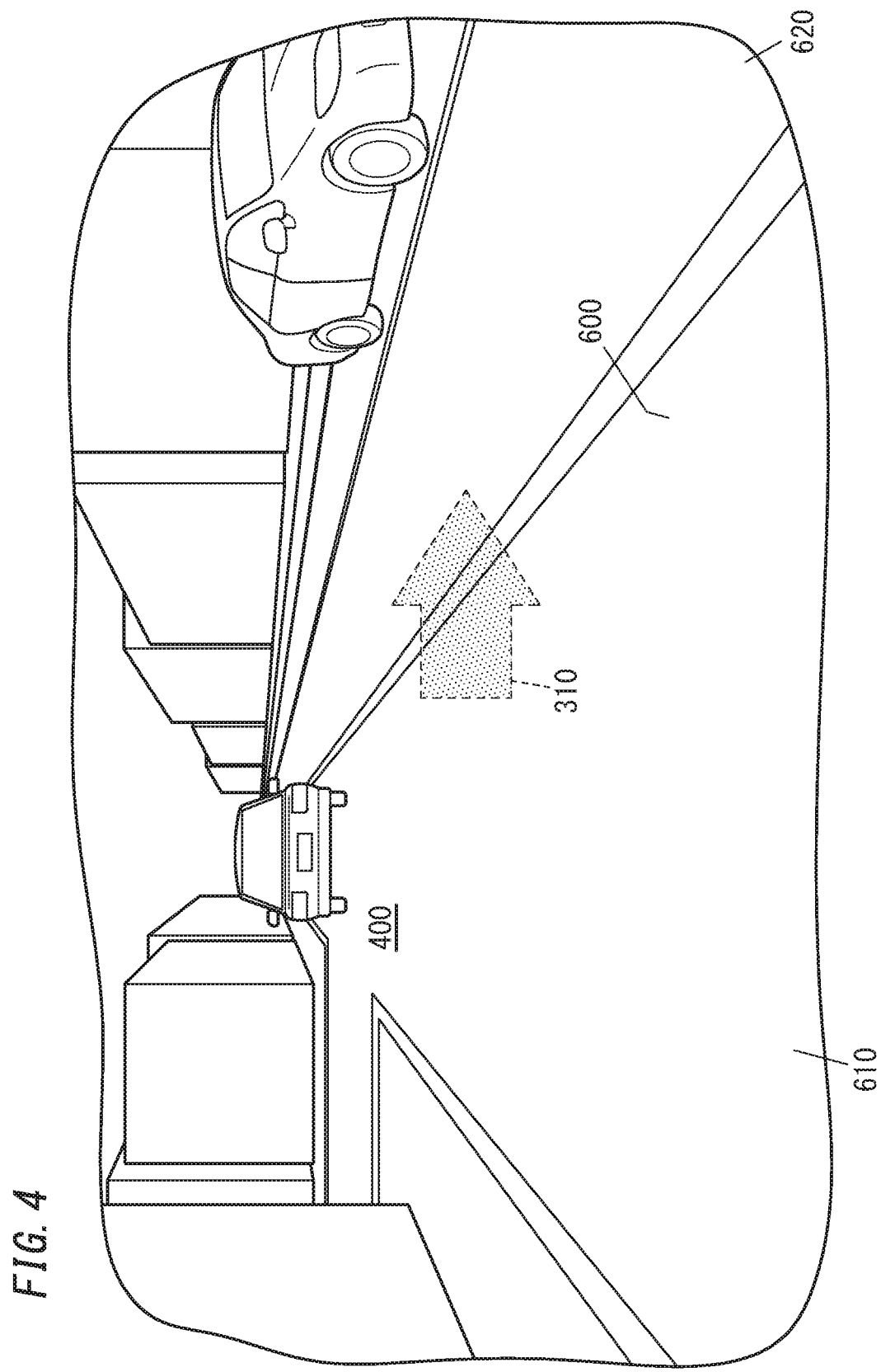
FIG. 4 is a conceptual view of a field of view of a user using the above image display system.

The display system 10 allows the user 200 to visually perceive a virtual image 310 formed in a target space 400 positioned in front of (outside) the automobile 100 over the wind shield 101. In this disclosure, a "virtual image" means an image which is formed by diffused rays of light caused when light emitted from the display system 10 is diffused by a reflective member such as the wind shield 101 and appears as if a real object. Therefore, as shown in FIG. 4, the user 200 can see the virtual image 310 which is formed by the display system 10 and is overlaid on a real space spreading in front of the automobile 100. Accordingly, the display system 10 can display the virtual image 310 indicating various driving assist information such as vehicle speed information, navigation information, pedestrian information, forward vehicle information, lane departure information, and vehicle condition information, and can allow the user 200 to visually perceive it. In FIG. 4, the virtual image 310 indicates navigation information exemplified by an arrow for lane change. Accordingly, when the user 200 trains his or her eyes on a space in front of the wind shield 101, the user 200 can visually obtain the driving assist information by slight movement of a line of his or her sight.

In the display system 10, the virtual image 310 created in the target space 400 is present within an imaginary plane 501 across an optical axis 500 of the display system 10. In the present embodiment, the optical axis 500 extends along a road surface 600 in front of the automobile 100 in the target space 400 in front of the automobile 100. And, the imaginary plane 501 where the virtual image 310 is created is inclined relative to the optical axis 500. An angle of the imaginary plane 501 to the optical axis 500 may not be limited particularly. Alternatively, the imaginary plane 501 may not be necessarily inclined relative to the optical axis 500 but may be perpendicular thereto.

Figure 5:
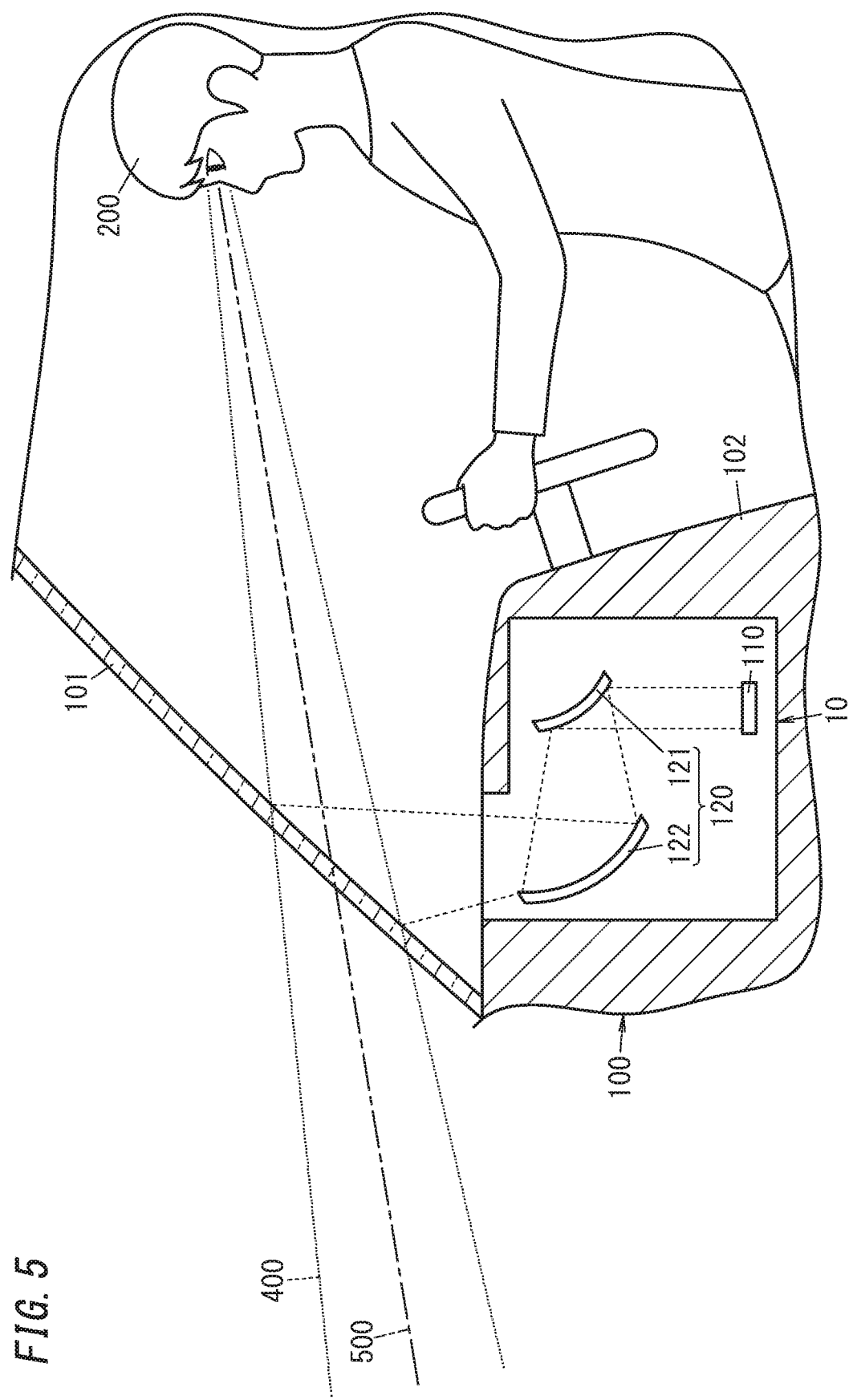
FIG. 5 is a conceptual view for illustration of a display system including the above image display system.

Next, configuration of the display system 10 is described. As shown in FIG. 5, the display system 10 includes the image display system 110 and a projection unit 120.

As shown in FIG. 1, the image display system 110 includes the luminaire 20, the driving unit 30, an optical system 40, the processing unit 50, and a detecting unit 60.

The luminaire 20 is configured to emit light for forming an image. The luminaire 20 includes a plurality of (three, in the present embodiment) light sources (21 to 23). Hereinafter, if necessary, the light source 21 is referred to as a first light source 21, the light source 22 is referred to as a second light source 22, and the light source 23 is referred to as a third light source 23. Each of the first light source 21, the second light source 22, and the third light source 23 is a laser (e.g., a semiconductor laser) outputting a laser beam. In this regard, the first light source 21 includes a red laser diode outputting a red laser beam. The second light source 22 includes a green laser diode outputting a green laser beam. The third light source 23 includes a blue laser diode outputting a blue laser beam.

The optical system 40 is used for forming an image by use of light from the luminaire 20. The optical system 40 includes mirrors 41, 42, and 43, a scanning mirror (scanning unit) 44, and a beam splitter 45. The mirrors 41, 42, and 43 are used to reflect light from the light sources 21, 22, and 23 toward the scanning mirror 44. The scanning mirror 44 is equipment for performing raster scanning (raster scan) which performs two-dimensional scanning with light. In the present embodiment, the scanning mirror 44 enables scanning with light from the luminaire 20 in two directions which are a horizontal direction (H direction) and a vertical direction (V direction). An example of the scanning mirror 44 may be a MEMS mirror with a two axis rotational mechanism. Alternatively, the scanning mirror 44 may be a polygon mirror. The beam splitter 45 is located between a set of the mirrors 41, 42, and 43 and the scanning mirror 44. The beam splitter 45 transmits light reflected from the mirrors 41, 42, and 43 to allow it to strike the scanning mirror 44 while reflecting light from the mirrors 41, 42, and 43 to allow it to strike the detecting unit 60. Note that, the optical system 40 may include one or more collimation lenses for collimating light from the light sources 21, 22, and 23 to allow them to strike the mirrors 41, 42, and 43, if necessary.

The detecting unit 60 is configured to measure luminance of the light sources 21, 22, and 23. The detecting unit 60 includes multiple photodiodes (red, green, and blue photodiodes) for individually detecting light from the light sources 21, 22, and 23. Output from the detecting unit 60 (outputs from the multiple photodiodes) is given to the processing unit 50.

The processing unit 50 includes an electric circuit (processing circuit) for controlling the image display system 110. In particular, the processing unit 50 is configured to control the driving unit 30 and the scanning mirror 44. The processing unit 50 controls the driving unit 30 and the scanning mirror 44 in accordance with the given image signal G10 to from an image corresponding to the image signal G10. The processing unit 50 may be realized by a computer system including one or more processors (microprocessors) and one or more memories, for example. Stated differently, one or more processors execute one or more programs stored in one or more memories to function as the processing unit 50. One or more programs may be stored in one or more memories in advance or provided in the form of being stored in one or more non-transitory recording media such as memory cards. Or, the processing unit 50 may be realized by an FPGA (field-programmable gate array) and/or an ASIC (application specific integrated circuit).

The processing unit 50 is configured to receive the image signal G10 from an external device. The image signal G10 represents data of an image displayed as the virtual image 310. The image signal G10 includes instruction values of luminance of individual pixels constituting an image. In the present embodiment, each pixel is constituted by three colors which are red, green, and blue. Accordingly, the image signal G10 includes instruction values of luminance of three colors of each of pixels constituting an image. In summary, the image signal G10 includes a plurality of instruction values respectively corresponding to the plurality of light sources 21 to 23. For example, when a gradation of luminance is represented in 256 levels, an instruction value is represented by a series of eight bits and has a value ranging from 0 to 255. Note that, examples of the external device may include a navigation system installed in the automobile 100.

The processing unit 50 is configured to determine target values of luminance of light sources based on the instruction values indicated by the image signal G10. In the present embodiment, the processing unit 50 determines a target value based on an instruction value indicated by the image signal G10 for each of the light sources 21 to 23. In the present embodiment, the processing unit 50 performs raster scanning by use of the scanning mirror, and therefore a constant period of time is allocated to each of pixels constituting an image. Therefore, in relation to a period of time allocated to a particular pixel, the processing unit 50 determines a target value based on an instruction value corresponding to the particular pixel. Thus, the processing unit 50 generates the luminance signal D10 indicating luminance of individual light sources from the image signal G10 and provides it to the driving unit 30. In this regard, the processing unit 50 sets a target value of luminance of a light source to the instruction value of the luminance of the light source indicated by the image signal G10. Further, the processing unit 50 performs temperature correction based on the output from the detecting unit 60. The processing unit 50 determines correction values of luminance of the light sources 21 to 23 of the luminaire 20 based on the output from the detecting unit 60 and outputs a correction signal indicative of the correction values to the driving unit 30. Such temperature correction to luminance of light from light sources may be realized by use of conventional methods. Note that, such temperature correction is optional. Further, the processing unit 50 may perform feedback control based on output from the detecting unit 60 so that the light sources 21 to 23 of the luminaire 20 have individual luminance corresponding to the instruction values.

The driving unit 30 is a circuit (driving circuit) for driving a plurality of light sources of the luminaire 20 (i.e., the first to third light sources 21 to 23). In the present embodiment, the light sources 21 to 23 are semiconductor lasers and therefore the driving unit 30 includes laser drivers. In detail, the driving unit 30 outputs the drive currents in accordance with the luminance signal D10 indicating the target values of the luminance of the light sources 21 to 23 given by the processing unit 50, to the light sources 21 to 23 to allow the light sources 21 to 23 to emit light. As described above, the driving unit 30 supplies the drive currents to the individual light sources 21 to 23 in accordance with the individual instruction values indicated by the image signal G10 received by the processing unit 50.

Figure 2:
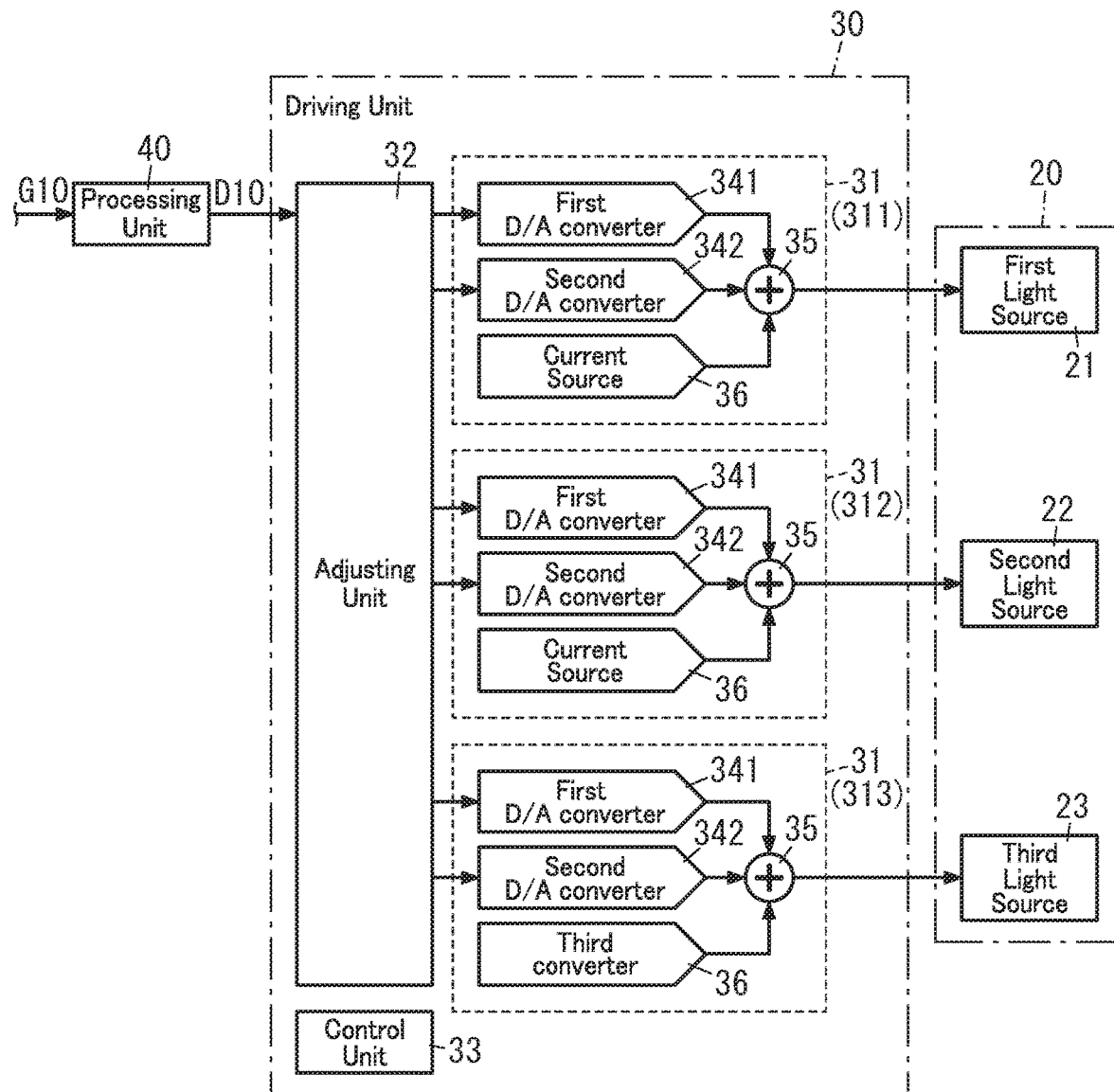
FIG. 2 is an explanatory diagram of primary part of the above image display system.

As shown in FIG. 2, the driving unit 30 includes a plurality of shaping circuits 31 (311 to 313), an adjusting unit 32, and a control unit 33. Hereinafter, if necessary, the shaping circuit 311 is referred to as a "first shaping circuit 311", the shaping circuit 312 is referred to as a "second shaping circuit 312", and the shaping circuit 313 is referred to as a "third shaping circuit 313". The first shaping circuit 311 provides a drive current to the first light source 21, the second shaping circuit 312 provides a drive current to the second light source 22, and the third shaping circuit 313 provides a drive current to the third light source 23.

Each of the shaping circuits 31 includes a plurality of D/A converters (digital-analog converters) 341 and 342, an arithmetic unit 35, and a current source 36.

Each of the plurality of D/A converters 341 and 342 is configured to output, in response to input of a digital signal, an analog signal corresponding to a value of the digital signal (i.e., a current with a value corresponding to a value represented by the digital signal). In particular, the plurality of D/A converters 341 and 342 each have a value of an analog signal linearly changing (monotonically increasing) relative to a value of a digital signal. The plurality of D/A converters 341 and 342 include a first D/A converter 341 and a second D/A converter 342. Resolution of the first D/A converter 341 is lower than resolution of the second D/A converter 342. For instance, the first D/A converter 341 has resolution of 5 bits and the second D/A converter 342 has resolution of 8 bits.

The arithmetic unit 35 is configured to output the drive current to the light source (21 to 23) based on a computation result of the analog signals outputted from the plurality of D/A converters (first and second D/A converters 341 and 342). In the present embodiment, the arithmetic unit 35 is an adder. Therefore, the computation result means a sum of the analog signals outputted from the plurality of D/A converters 341 and 342.

The current source 36 is a current source for providing an offset current for the drive current. The current outputted from the current source 36 (the offset current) is given to the arithmetic unit 35. Thus, the arithmetic unit 35 adds the offset current from the current source 36 to the sum of the analog signals outputted from the first and second D/A converters 341 and 342 to thereby generate the drive current.

The adjusting unit 32 is configured to determine values of digital signals inputted into the plurality of D/A converters 341 and 342 of the shaping circuit 31 in accordance with a target value of luminance of a light source indicated by the luminance signal D10 (an instruction value of the image signal G10). In particular, the adjusting unit 32 is configured to determine the values of the digital signals inputted into the plurality of D/A converters 341 and 342 of the shaping circuit 31 in accordance with the instruction value so that a relation between change in the luminance and change in the instruction value comes close to a linear relationship. In the present embodiment, the adjusting unit 32 determines the values of the digital signals inputted into the first and second D/A converters 341 and 342 for each of the first shaping circuit 311, the second shaping circuit 312, and the third shaping circuit 313. The adjusting unit 32 described above serves as an interface for providing digital signals to the plurality of D/A converters 341 and 342 based on a digital signal given by the processing unit 50 (the luminance signal D10). The adjusting unit 32 can be realized by a serial-parallel converter or a decoder.

Figure 6:
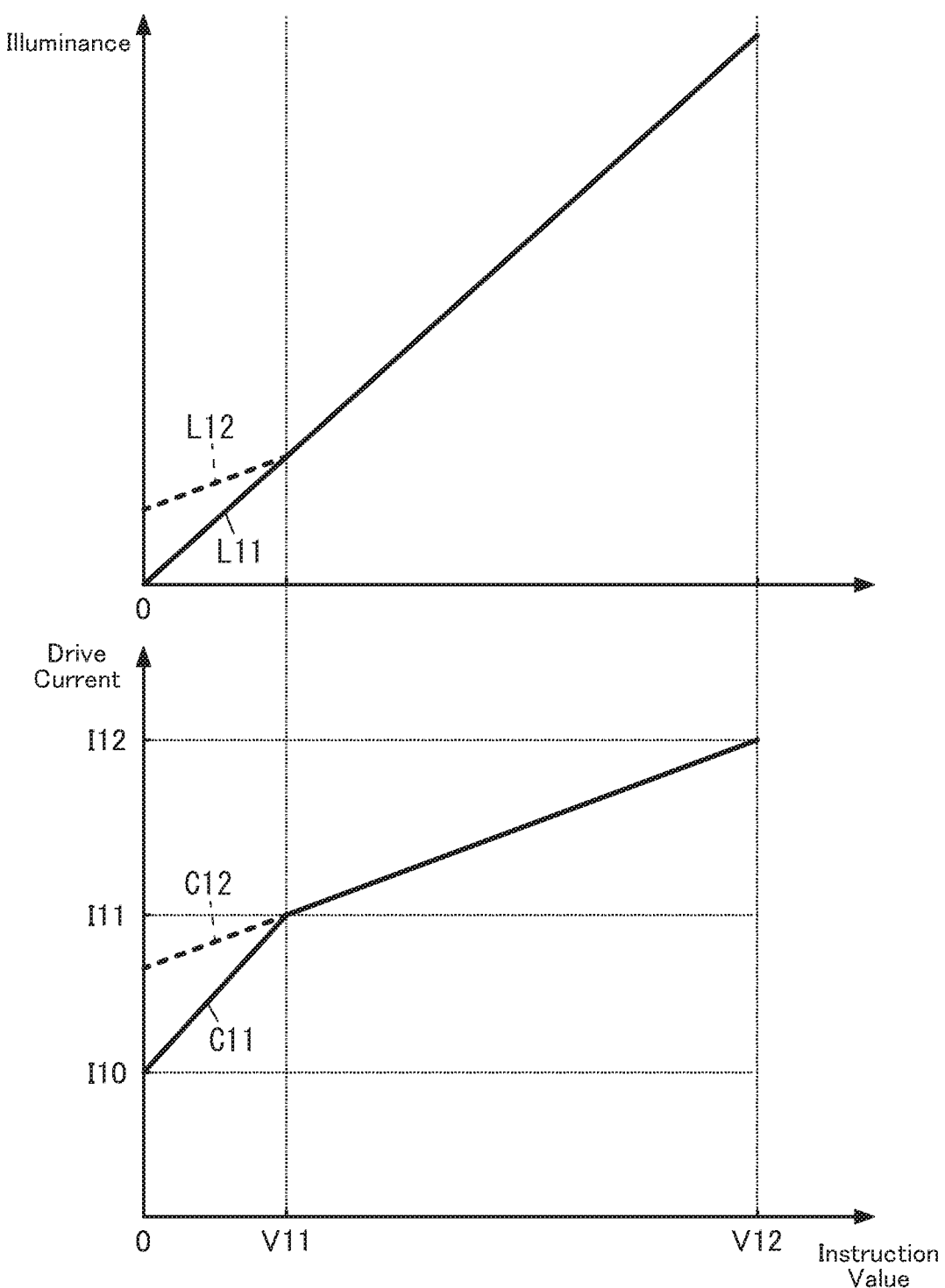
FIG. 6 is a graph representing changes in a drive current and luminance relative to an instruction value in the above image display system.

Hereinafter, the adjusting unit 32 is described with reference to FIG. 6. In FIG. 6, C11 represents a change in the drive current according to the present embodiment, and C12 represents a change in the drive current according to a comparison example. Further, in FIG. 6, L11 represents a change in luminance corresponding to C11 and L12 represents a change in luminance corresponding to C12.

The adjusting unit 32 is configured to provide a digital signal having a value changing in accordance with the instruction value of the image signal G10 to the first D/A converter 341 when the instruction value of the image signal G10 falls within a first numerical range. In this regard, the adjusting unit 32 does not use the second D/A converter 342. In detail, the adjusting unit 32 provides a digital signal to the second D/A converter 342, wherein the digital signal allows the second D/A converter 342 to output an analog signal with a value of 0. As shown in FIG. 6, the first numerical range is a range from 0 (i.e., a lower limit value) to a value V11 (i.e., an upper limit value). In one example, the value V11 is 31 when the luminance is represented in 256 levels. When the instruction value is 0, the adjusting unit 32 provides the first D/A converter 341 with a digital signal which allows the first D/A converter 341 to output an analog signal with a value of 0. In contrast, when the instruction value is V11, the adjusting unit 32 provides the first D/A converter 341 with a digital signal which allows the first D/A converter 341 to output an analog signal with the maximum value. Accordingly, in the first numerical range (0 to V11), the drive current increases from I10 to I11 monotonically. Note that, I10 represents a value of the offset current. Further, the value I11 of the drive current when the instruction value is V11 corresponds to a threshold current between a spontaneous emission region and a laser oscillation region of a laser serving as a light source.

The adjusting unit 32 is configured to provide a digital signal having a fixed value to the first D/A converter 341 and provide a digital signal having a value changing in accordance with the instruction value to the second D/A converter 342 when the instruction value of the image signal G10 falls within a second numerical range. The second numerical range is a range of numerical values larger than those of the first numerical range. As shown in FIG. 6, the second numerical range is a range from a value V11' (i.e., a lower limit value) to a value V12 (i.e., an upper limit value). The value V11' is larger than the value V11. In the present embodiment, the value V11' is a value just next to the value V11. In one example, the value V11' is 32 when the luminance is represented in 256 levels. In one example, the value V12 is 255 when the luminance is represented in 256 levels. Further, the digital signal having the fixed value given to the first D/A converter 341 is a digital signal which allows the first D/A converter 341 to output an analog signal with the maximum value. Stated differently, when the instruction value of the image signal G10 falls within the second numerical range, the first D/A converter 341 is used as a constant current source. When the instruction value is V11', the adjusting unit 32 provides the second D/A converter 342 with a digital signal which allows the second D/A converter 342 to output an analog signal with a value of 0. In contrast, when the instruction value is V12, the adjusting unit 32 provides the second D/A converter 342 with a digital signal which allows the second D/A converter 342 to output an analog signal with the maximum value. Accordingly, in the second numerical range (V11' to V12), the drive current increases from I11 to I12 monotonically.

In this regard, it is supposed that the first D/A converter 341 has resolution of 5 bits and a magnitude of an analog signal outputted from the first D/A converter 341 when a value D1 of an inputted digital signal is 31 is represented by Id1. In this supposition, the magnitude of the analog signal outputted from the first D/A converter 341 is given by a relation of Id1×D1/31. In contrast, it is supposed that the second D/A converter 342 has resolution of 8 bits and a magnitude of an analog signal outputted from the second D/A converter 342 when a value D2 of an inputted digital signal is 224 is represented by Id2. In this supposition, the magnitude of the analog signal outputted from the second D/A converter 342 is given by a relation of Id2×D2/224. Further, it is supposed that a magnitude of the drive current is represented by Idr and the instruction value is represented by D. In this supposition, when the instruction value D is in the first numerical range (0 to 31), Idr is given by a relation of Idr=I10+Id1×D/31. When the instruction value D is in the second numerical range (32 to 255), Idr is given by a relation of Idr=I10+Id1+Id2×(D−31)/224.

In the present embodiment, the first D/A converter 341 and the second D/A converter 342 are different in amount of change in an analog signal relative to a value of a digital signal. Particularly, as shown in C11 of FIG. 6, amount of change in an analog signal relative to a value of a digital signal is larger in the first D/A converter 341 than in the second D/A converter 342. Accordingly, in the spontaneous emission region (the first numerical range), change in the drive current relative to change in the instruction value is increased and therefore change in luminance of light sources is also increased. In contrast, in the laser oscillation region (the second numerical range), change in the drive current relative to change in the instruction value is decreased and therefore change in luminance of light sources is also decreased. By doing so, as shown by L11 in FIG. 6, luminance of light sources is made to change linearly relative to the instruction value throughout the spontaneous emission region (the first numerical range) and the laser oscillation region (the second numerical range). In this regard, C12 in FIG. 6 denotes a case where the drive current is changed constantly relative to the instruction value throughout the spontaneous emission region (the first numerical range) and the laser oscillation region (the second numerical range). To facilitate understanding, a slope of the drive current of C12 is equal to a slope of the drive current given by the second D/A converter 342. As shown by L12, a slope of luminance at this time is smaller in the first numerical range than in the second numerical range. Therefore, luminance of light sources does not change linearly relative to the instruction value, provided that the drive current changes linearly relative to the instruction value.

Accordingly, the image display system 110 is capable of adjusting change in actual luminance of the light source 21 to 23 relative to change in the instruction value of luminance of the light source 21 to 23. Especially, according to such adjustment, a relation between change in the luminance of the light source and change in the instruction value of the luminance of the image signal G10 can be made to come close to a linear relationship. Consequently, improvement of reproducibility of an image can be expected.

The control unit 33 mainly adjusts operation timings of the first and second D/A converters 341 and 342 as well as a magnitude of the offset current from the current source 36. The control unit 33 adjusts the magnitude of the offset current from the current source 36 based on the correction value indicated by the correction signal given by the processing unit 50. Thus, it is possible to reduce change in luminance of light from the luminaire 20 which is caused by change in a surrounding (environmental) temperature and the like.

In addition, the processing unit 50 generates a horizontal synchronization signal and a vertical synchronization signal from the image signal G10 received, and provides them to the scanning mirror 44. To sum up, the processing unit 50 generates the luminance signal D10 indicating luminance of each light source from the image signal G10 and provides it to the driving unit 30, and generates the horizontal synchronization signal and the vertical synchronization signal from the image signal G10 and provides them to the scanning mirror 44. By doing so, the processing unit 50 forms an image corresponding to the image signal G10.

The projection unit 120 is used for projecting the virtual image 310 corresponding to an image formed by the image display system 110 onto the target space 400. As shown in FIG. 5, the projection unit 120 includes a first optical member 121 and a second optical member 122. In other words, the projection unit 120 is an optical system including the first optical member 121 and the second optical member 122. The first optical member 121 reflects light from the image display system 110 (light constituting an image displayed on the display screen) toward the second optical member 122. The second optical member 122 reflects light from the first optical member 121 toward the window shield 101 (see FIG. 5). In summary, the projection unit 120 forms the virtual image 310 in the target space 400 by projecting the image formed by the image display system 110 onto the window shield 101.

2. Variations

Embodiments of the present disclosure are not limited to the above embodiment. The above embodiment may be modified in various ways in accordance with design or the like as it can achieve the object of the present disclosure. Hereinafter, variations of the above embodiment are listed.

2.1 First Variation

Figure 7:
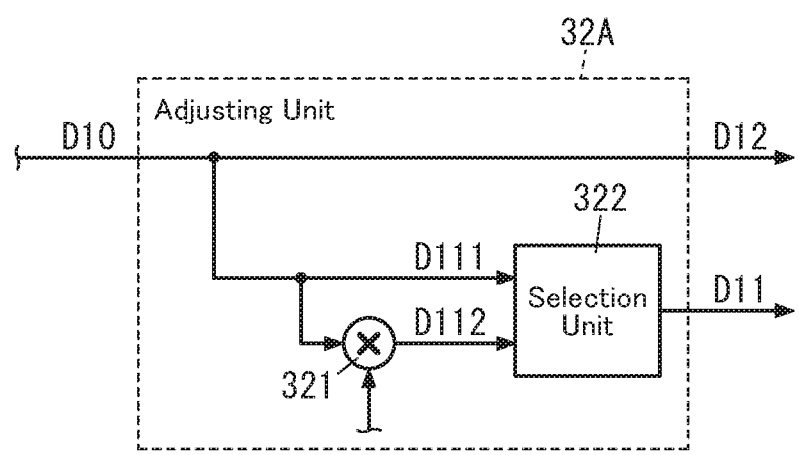
FIG. 7 is an explanatory diagram of illustration for an adjusting unit of a driving unit of a first variation of the above image display system.

FIG. 7 is illustration for an adjusting unit 32A of the first variation of the image display system 110. The adjusting unit 32A is configured to determine values of digital signals inputted into the plurality of D/A converters 341 and 342 of the shaping circuit 31 in accordance with the target value of luminance of the light source indicated by the luminance signal D10 (the instruction value of the image signal G10). Especially, the adjusting unit 32A is configured to determine the values of the digital signals inputted into the plurality of D/A converters 341 and 342 of the shaping circuit 31 in accordance with the instruction value so that a relation between change in the luminance and change in the instruction value comes close to a linear relationship. The adjusting unit 32A is configured to determine values of digital signals inputted into the first and second D/A converters 341 and 342 for each of the first shaping circuit 311 corresponding to the first light source 21, the second shaping circuit 312 corresponding to the second light source 22, and the third shaping circuit 313 corresponding to the third light source 23.

The adjusting unit 32A is configured to divide a series of bits indicative of the target value of the luminance signal D10 (the instruction value of the image signal G10) into (two parts which are) a series of lower bits including a least significant bit and a series of upper bits including a most significant bit. The adjusting unit 32A is configured to provide a digital signal (output digital signal) D11 based on the series of lower bits to the first D/A converter 341 and provide a digital signal (output digital signal) D12 based on the series of upper bits to the second D/A converter (342). In this regard, differently from the above embodiment, the first D/A converter 341 has resolution of 7 bits and the second D/A converter 342 has resolution of 3 bits.

In this regard, gradation of luminance is supposed to be represented in 256 levels. In this case, a series of bits indicative of the instruction value includes 8 bits. The adjusting unit 32A divides the series of 8 bits into a series of lower 5 bits and a series of upper 3 bits, for example. In a concrete example, the adjusting unit 32A divides the series of 8 bits "00011111" into two parts which are the series of 5 bits "11111" and the series of 3 bits "000". In FIG. 7, D111 denotes a digital signal corresponding to the series of lower bits, and D12 represents a digital signal corresponding to the series of upper bits.

The adjusting unit 32A outputs the digital signal D12 corresponding to the series of upper bits to the second D/A converter 342 without any substantial modification. In contrast, the adjusting unit 32A adjusts the digital signal D111 corresponding to the series of lower bits in accordance with the instruction value. For this purpose, the adjusting unit 32A includes an arithmetic unit 321 and a selection unit 322.

The arithmetic unit 321 generates an adjusted digital signal D112 by executing digital computing based on the digital signal D111 and provides it to the selection unit 322. The arithmetic unit 321 generates the adjusted digital signal D112 by multiplying the digital signal D111 by a predetermined value. In one example, the predetermined value may be a ratio of change in a value of an analog signal relative to a value of a digital signal regarding the first D/A converter 341 to change in a value of an analog signal relative to a value of a digital signal regarding the second D/A converter 342. For example, when the predetermined value is 4, the arithmetic unit 321 converts the series of five lower bits indicated by the digital signal D111 into a digital signal (adjusted digital signal) D112 indicating a series of 7 bits. This predetermined value means a value defining weighting to the digital signal D111, and may be adjustable appropriately.

The selection unit 322 is configured to select one of the digital signal D111 and the adjusted digital signal D112 and provide a selected one as an output digital signal D11 to the first D/A converter 341.

When the instruction value of the image signal G10 (the target value of the luminance signal D10) falls within the first numerical range, the selection unit 322 selects the adjusted digital signal D112 as the output digital signal D11. The first numerical range ranges from 0 to 31, for example. In the first numerical range, a magnitude of an analog signal outputted from the first D/A converter 341 changes linearly relative to the instruction value. In this case, the digital signal D12 corresponding to the series of upper bits is "000" and therefore the magnitude of the analog signal outputted from the second D/A converter 342 is 0. Consequently, in the first numerical range (0 to 31), the drive current monotonically increases with increase in the magnitude of the analog signal outputted from the first D/A converter 341 (increase in the instruction value).

When the instruction value of the image signal G10 (the target value of the luminance signal D10) falls within the second numerical range, the selection unit 322 selects the digital signal D111 as the output digital signal D11. The second numerical range is a range of numerical values larger than those in the first numerical range. The second numerical range ranges from 32 to 255, for example. In the second numerical range, a magnitude of an analog signal outputted from the first D/A converter 341 changes linearly relative to the instruction value in a similar manner to the first numerical range. However, in the first numerical range, the adjusted digital signal D112 is inputted into the first D/A converter 341 instead of the digital signal D111. Accordingly, change in the magnitude of the analog signal relative to the instruction value is larger in the first numerical range than in the second numerical range. Further, in the second numerical range, the digital signal D12 corresponding to the series of upper bits is allowed to be equal to or greater than "000" and therefore the second D/A converter 342 can output an analog signal. Therefore, in the second numerical range (32 to 255), the drive current increases monotonically with increase in the magnitudes of the analog signals outputted from the first and second D/A converters 341 and 342 (increase in the instruction value).

In this regard, it is supposed that the first D/A converter 341 has resolution of 7 bits, a magnitude of an analog signal outputted from the first D/A converter 341 when the inputted digital signal D11 has a value of 127 is represented by Id1, and the series of lower bits has a value of DL. In the first numerical range (0 to 31), the value DL of the series of lower bits is quadrupled and therefore the magnitude of the analog signal outputted from the first D/A converter 341 is represented by a relation of Id1×4DL/127. In the second numerical range (32 to 255), the value DL of the series of lower bits is used without any modification and therefore the magnitude of the analog signal outputted from the first D/A converter 341 is represented by a relation of Id1×DL/127. Additionally, it is supposed that the second D/A converter 342 has resolution of 3 bits, a magnitude of an analog signal outputted from the second D/A converter 342 when the inputted digital signal D12 has a value of 8 is represented by Id2, and the series of upper bits has a value of DH. Under this supposition, the magnitude of the analog signal outputted from the second D/A converter 342 is given by a relation of Id2×DH/8. When the drive current is supposed to have a magnitude of Idr, Idr is given by a relation of Idr=I10+Id1×4DL/127 when the instruction value is in the first numerical range (0 to 31). When the instruction value is in the second numerical range (32 to 255), Idr is given by a relation of Idr=I10+Id1×DL/127+Id2×DH/8. Note that, I10 denotes a value of the offset current.

In the present variation, the first D/A converter 341 and the second D/A converter 342 are different in amount of change in an analog signal relative to a value of a digital signal. Particularly, amount of change in an analog signal relative to a value of a digital signal is larger in the first D/A converter 341 than in the second D/A converter 342. In addition, regarding to the first D/A converter 341, amount of change in an analog signal relative to a value of a digital signal is larger in first numerical range than in the second numerical range. Accordingly, in the spontaneous emission region (the first numerical range), change in the drive current relative to change in the instruction value is increased and therefore change in luminance of light sources is also increased. In contrast, in the laser oscillation region (the second numerical range), change in the drive current relative to change in the instruction value is decreased and therefore change in luminance of light sources is also decreased. By doing so, luminance of light sources is made to change linearly relative to the instruction value throughout the spontaneous emission region (the first numerical range) and the laser oscillation region (the second numerical range).

Accordingly, the image display system 110 of the present variation is capable of adjusting change in actual luminance of the light source 21 to 23 relative to change in the instruction value of luminance of the light source 21 to 23. Especially, according to such adjustment, a relation between change in the luminance of the light source and change in the instruction value of the luminance of the image signal G10 can be made to come close to a linear relationship. Consequently, improvement of reproducibility of an image can be expected.

2.2 Second Variation

Figure 8:
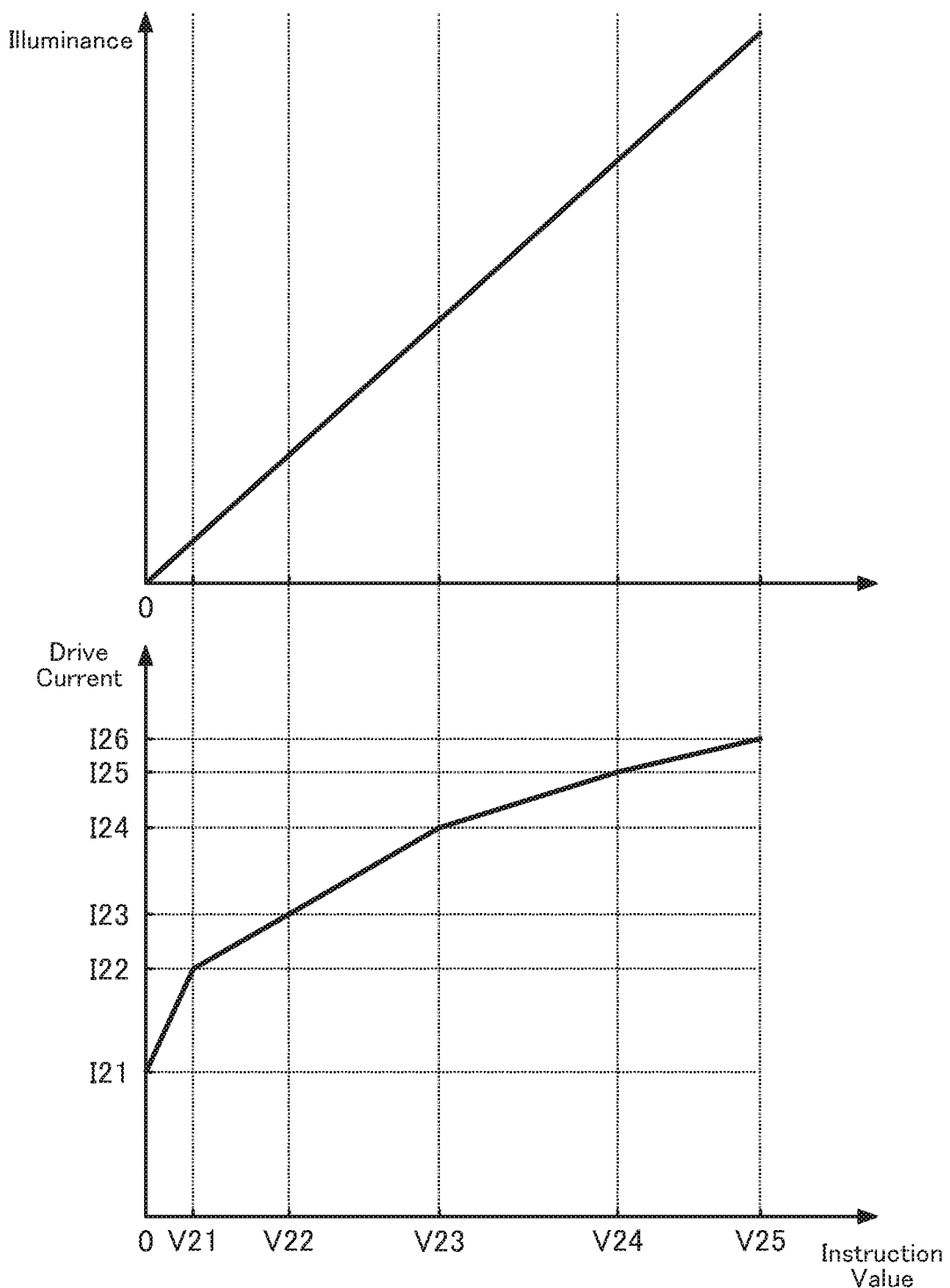
FIG. 8 is a graph representing changes in a drive current and luminance relative to an instruction value in a second variation of the above image display system.

In the second variation, each of the shaping circuits 31 of the driving unit 30 may include five D/A converters (first to fifth D/A converters). Hereinafter, the adjusting unit 32 in this case is described with reference to FIG. 8. When the instruction value of the image signal G10 falls within the first numerical range (0 to V21), the adjusting unit 32 provides a digital signal with a value changing in accordance with the instruction value of the image signal G10 to the first D/A converter and also provides a digital signal causing an analog signal to have a value of 0 to each of the second to fifth D/A converters. Consequently, the adjusting unit 32 monotonically increases the drive current from I21 to I22 in the first numerical range (0 to V21). Note that, I21 in FIG. 8 denotes a value of the offset current. When the instruction value of the image signal G10 falls within the second numerical range (V21 to V22), the adjusting unit 32 provides a digital signal with a fixed value to the first D/A converter. In addition, the adjusting unit 32 provides a digital signal with a value changing in accordance with the instruction value of the image signal G10 to the second D/A converter and also provides a digital signal causing an analog signal to have a value of 0 to each of the third to fifth D/A converters. Consequently, the adjusting unit 32 monotonically increases the drive current from I22 to I23 in the second numerical range (V21 to V22). When the instruction value of the image signal G10 falls within the third numerical range (V22 to V23), the adjusting unit 32 provides a digital signal with a fixed value to each of the first and second D/A converters. In addition, the adjusting unit 32 provides a digital signal with a value changing in accordance with the instruction value of the image signal G10 to the third D/A converter and also provides a digital signal causing an analog signal to have a value of 0 to each of the fourth and fifth D/A converters. Consequently, the adjusting unit 32 monotonically increases the drive current from I23 to I24 in the third numerical range (V22 to V23). When the instruction value of the image signal G10 falls within the fourth numerical range (V23 to V24), the adjusting unit 32 provides a digital signal with a fixed value to each of the first to third D/A converters. In addition, the adjusting unit 32 provides a digital signal with a value changing in accordance with the instruction value of the image signal G10 to the fourth D/A converter and also provides a digital signal causing an analog signal to have a value of 0 to the fifth D/A converter. Consequently, the adjusting unit 32 monotonically increases the drive current from I24 to I25 in the fourth numerical range (V23 to V24). When the instruction value of the image signal G10 falls within the fifth numerical range (V24 to V25), the adjusting unit 32 provides a digital signal with a fixed value to each of the first to fourth D/A converters and provides a digital signal with a value changing in accordance with the instruction value of the image signal G10 to the fifth D/A converter. Consequently, the adjusting unit 32 monotonically increases the drive current from I25 to I26 in the fifth numerical range (V24 to V25). According to such adjustment, a relation between change in the luminance of the light source and change in the instruction value of the luminance of the image signal G10 can be made to come close to a linear relationship. Consequently, improvement of reproducibility of an image can be expected. As understood from the above, the shaping circuit 31 may not be limited to including two D/A converters 341 and 342 but may include three or more D/A converters. Increase in the number of D/A converters enables fine adjustment of change in actual luminance of light source(s) to change in the instruction value of luminance of the light source(s).

2.3 Other Variations

The driving unit 30 may include a shaping circuit 31 for at least one of the plurality of light sources 21 to 23. For example, the shaping circuit 31 may be omitted for a light source which is hardly influenced by change in luminance due to a drive current linearly changing relative to the instruction value.

It may be possible to set two or more numerical ranges for the instruction value and such numerical ranges are not required to correspond to a spontaneous emission region (the first numerical range) and a laser oscillation region (the second numerical range) of a laser. For example, numerical ranges may be set based on differential values of luminance of a light source relative to a drive current. In summary, numerical ranges may be appropriately set so that change in an instruction value of luminance of the image signal G10 relative to change in an instruction value shows desired change.

In the shaping circuit 31, the arithmetic unit 35 may perform subtraction in addition to or as alternative to addition with regard to the analog signals outputted from the plurality of D/A converters 341 and 342. In summary, the computation result is a sum of or a difference between the analog signals outputted from the plurality of D/A converters. The arithmetic unit 35 may perform multiplication or division with regard to the analog signals outputted from the plurality of D/A converters 341 and 342. To sum up, the arithmetic unit 35 may perform four arithmetic operations with regard to analog signals outputted from the plurality of D/A converters 341 and 342.

A light source of the luminaire 20 may not be limited to a laser but may be a light emitting diode (LED).

Colors of light emitted from the plurality of light sources 21 to 23 may not be limited to three colors of red, green and blue. The colors of light may be selected appropriately in accordance with application or the like of the image display system 110. The number of light sources included in the luminaire 20 may not be limited to three but may be two or four or more. Similarly, the number of colors of light may not be limited to three but may be two or four or more. The luminaire 20 may not necessarily include a plurality of light sources 21 to 23 emitting light with different wavelengths. The number of light sources included in the luminaire 20 may be one and similarly the number of colors of light may be one.

The display system 10 including the image display system 110 may not be limited to a configuration of forming the virtual image 310 in the target space 400 set in front of a movable object (the automobile 100) in relation to a moving direction thereof. However, the display system 10 may form the virtual image 310 beside, behind, or over the movable object in relation to the moving direction thereof, for example. The display system 10 may apply to not only a head-up display used in the automobile 100 but also a movable object other than the automobile 100, such as a bicycle, a train, an airplane, a construction machine, a boat, and a ship. The display system 10 may not be limited to being used in movable objects but may be used in amusement facilities. The display system 10 may be used in: a wearable terminal such as a head mounted display (HMD); medical equipment; or stationary equipment.

The processing unit 50 and the driving unit 30 of the image display system 110 may apply to not only a scanning display as described in the above embodiment but also a liquid crystal display and an LED vision used for a digital signage.

3. Aspects

As obviously understood from the embodiments and variations, the present disclosure contains the following aspects. In the following, the reference signs in parentheses are introduced in order to clearly indicate relation between the aspects and the embodiment and variations.

An image display system (110) of a first aspect is an image display system for forming an image by use of light from a light source (21 to 23) of a luminaire (20) and includes: a processing unit (50) and a driving unit (30). The processing unit (50) is configured to receive an image signal (G10) indicative of an instruction value of luminance of the light source (21 to 23). The driving unit (30) is configured to supply a drive current to the light source (21 to 23) in accordance with the instruction value indicated by the image signal (G10) received by the processing unit (50). The driving unit (30) includes a shaping circuit (31) and an adjusting unit (32; 32A). The shaping circuit (31) includes: a plurality of D/A converters (341, 342) and an arithmetic unit (35). The plurality of D/A converters (341, 342) are each configured to, in response to input of a digital signal, output an analog signal corresponding to a value of the digital signal. The arithmetic unit (35) is configured to output the drive current to the light source (21 to 23) based on a computation result of analog signals outputted from the plurality of D/A converters (341, 342). The adjusting unit (32; 32A) is configured to determine values of digital signals inputted into the plurality of D/A converters (341, 342) of the shaping circuit (31) in accordance with the instruction value. Accordingly, the first aspect is capable of adjusting change in actual luminance of the light source relative to change in the instruction value of luminance of the light source.

An image display system (110) of a second aspect would be realized in combination with the first aspect. In the second aspect, the plurality of D/A converters (341, 342) each have a value of an analog signal linearly changing relative to a value of a digital signal. Accordingly, the second aspect is capable of adjusting change in actual luminance of the light source relative to change in the instruction value of luminance of the light source.

An image display system (110) of a third aspect would be realized in combination with the first or second aspect. In the third aspect, the plurality of D/A converters (341, 342) include at least a first D/A converter (341) and a second D/A converter (342) which are different in amount of change in an analog signal relative to a value of a digital signal. Accordingly, the third aspect is capable of more finely adjusting change in actual luminance of the light source relative to change in the instruction value of luminance of the light source.

An image display system (110) of a fourth aspect would be realized in combination with the third aspect. In the fourth aspect, the adjusting unit (32A) is configured to divide a series of bits indicative of the instruction value into a series of lower bits including a least significant bit and a series of upper bits including a most significant bit. The adjusting unit (32A) is configured to provide a digital signal based on the series of lower bits to the first D/A converter (341) and provide a digital signal based on the series of upper bits to the second D/A converter (342). Accordingly, the fourth aspect enables use of lower resolution D/A converters as the first and second D/A converters (341, 342).

An image display system (110) of a fifth aspect would be realized in combination with the third aspect. In the fifth aspect, the adjusting unit (32) is configured to provide a digital signal having a value changing in accordance with at least the instruction value to the first D/A converter (341) when the instruction value falls within a first numerical range (0 to V11). the adjusting unit (32) is configured to provide a digital signal having a fixed value to the first D/A converter (341) and provide a digital signal having a value changing in accordance with at least the instruction value to the second D/A converter (342) when the instruction value falls within a second numerical range (V11' to V12) of numerical values larger than those of the first numerical range. Accordingly, the fifth aspect enables use of the first D/A converter (341) as a constant current source and can simplify a circuit configuration.

An image display system (110) of a sixth aspect would be realized in combination with the fifth aspect. In the sixth aspect, the adjusting unit (32) is configured to provide, to the first D/A converter (341), a digital signal allowing the first D/A converter (341) to output an analog signal with a value of zero when the instruction value is equal to a lower limit value (0) of the first numerical range. Accordingly, the sixth aspect can simplify a circuit configuration.

An image display system (110) of a seventh aspect would be realized in combination with the fifth or sixth aspect. In the seventh aspect, the adjusting unit (32) is configured to provide, to the first D/A converter (341), a digital signal allowing the first D/A converter (341) to output an analog signal with a maximum value when the instruction value is equal to an upper limit value (V11) of the first numerical range (0 to V11). Accordingly, the seventh aspect can simplify a circuit configuration.

An image display system (110) of an eighth aspect would be realized in combination with any one of the fifth to seventh aspects. In the eighth aspect, a digital signal with the fixed value is a digital signal allowing the first D/A converter (341) to output an analog signal with a maximum value. Accordingly, the eighth aspect can simplify a circuit configuration.

An image display system (110) of a ninth aspect would be realized in combination with any one of the fifth to eighth aspects. In the ninth aspect, the adjusting unit (32) is configured to provide, to the second D/A converter (342), a digital signal allowing the second D/A converter (342) to output an analog signal with a value of zero when the instruction value is equal to a lower limit value (V11') of the second numerical range (V11' to V12). Accordingly, the ninth aspect can simplify a circuit configuration.

An image display system (110) of a tenth aspect would be realized in combination with any one of the fifth to ninth aspects. In the tenth aspect, the adjusting unit (32) is configured to provide, to the second D/A converter (342), a digital signal allowing the second D/A converter (342) to output an analog signal with a maximum value when the instruction value is equal to an upper limit value (V12) of the second numerical range (V11' to V12). Accordingly, the tenth aspect can simplify a circuit configuration.

An image display system (110) of an eleventh aspect would be realized in combination with any one of the third to tenth aspects. In the eleventh aspect, resolution of the first D/A converter (341) is lower than resolution of the second D/A converter (342). Accordingly, the eleventh aspect can simplify a circuit configuration.

An image display system (110) of a twelfth aspect would be realized in combination with any one of the first to eleventh aspects. In the twelfth aspect, the shaping circuit (31) includes a current source (36) for supplying an offset current for the drive current. Accordingly, the twelfth aspect is capable of adjusting change in actual luminance of the light source relative to change in the instruction value of luminance of the light source.

An image display system (110) of a thirteenth aspect would be realized in combination with the twelfth aspect. In the thirteenth aspect, the arithmetic unit (35) is configured to generate the drive current by adding the offset current to the computation result of the analog signals outputted from the plurality of D/A converters (341, 342). Accordingly, the thirteenth aspect is capable of adjusting change in actual luminance of the light source relative to change in the instruction value of luminance of the light source.

An image display system (110) of a fourteenth aspect would be realized in combination with any one of the first to thirteenth aspects. In the fourteenth aspect, the light source (21 to 23) includes a laser. Accordingly, the fourteenth aspect can improve quality of the image.

An image display system (110) of a fifteenth aspect would be realized in combination with any one of the first to fourteenth aspects. In the fifteenth aspect, the image display system (110) further includes a scanning unit (44) configured to perform scanning with light from the light source (21 to 23). The processing unit (50) is configured to control the scanning unit (44) based on the image signal (G10) to form the image. Accordingly, the fifteenth aspect can realize a scanning image display system.

An image display system (110) of a sixteenth aspect would be realized in combination with any one of the first to fifteenth aspects. In the sixteenth aspect, the adjusting unit (32) is configured to determine the values of the digital signals inputted into the plurality of D/A converters (341, 342) of the shaping circuit (31) in accordance with the instruction value so that a relation between change in the luminance and change in the instruction value comes close to a linear relationship. Accordingly, the sixteenth aspect can improve reproducibility of the image.

An image display system (110) of a seventeenth aspect would be realized in combination with any one of the first to sixteenth aspects. In the seventeenth aspect, the luminaire (20) includes a plurality of the light sources (21 to 23) emitting light with mutually different wavelengths. The driving unit (30) includes the shaping circuit (31) for at least one of the plurality of light sources (21 to 23). Accordingly, the seventeenth aspect can improve quality of the image.

An image display system (110) of an eighteenth aspect would be realized in combination with any one of the first to seventeenth aspects. In the eighteenth aspect, the computation result is a sum of or a difference between the analog signals outputted from the plurality of D/A converters (341, 342). Accordingly, the eighteenth aspect can simplify a circuit configuration.

A movable object (100) of a nineteenth aspect includes: the image display system (110) of any one of the first to eighteenth aspects; and a body (100a) where the image display system (110) is installed. Accordingly, the nineteenth aspect is capable of adjusting change in actual luminance of the light source relative to change in the instruction value of luminance of the light source.

An image display method of twentieth aspect is an image display method for forming an image by use of light from a light source (21 to 23) of a luminaire (20) and includes: receiving an image signal (G10) indicative of an instruction value of luminance of the light source (21 to 23); determining values of digital signals inputted into a plurality of D/A converters (341, 342) in accordance with the instruction value; and outputting the drive current to the light source (21 to 23) based on a computation result of analog signals outputted from the plurality of D/A converters (341, 342). Accordingly, the twentieth aspect is capable of adjusting change in actual luminance of the light source relative to change in the instruction value of luminance of the light source.

An image display program of twenty-first aspect is a program enabling a computer system to implement the image display method of the twentieth aspect. Accordingly, the twenty-first aspect is capable of adjusting change in actual luminance of the light source relative to change in the instruction value of luminance of the light source.

While various embodiments have been described herein above, it is to be appreciated that various changes in form and detail may be made without departing from the spirit and scope of the present disclosure presently or hereafter claimed.

The entire contents of Japanese Patent Application No. 2018-066196 mentioned above are incorporated by reference.

The invention claimed is:

1. An image display system for forming an image by use of light from a light source of a luminaire, the image display system comprising:
   a processing unit configured to receive an image signal indicative of an instruction value of luminance of the light source; and
   a driving unit configured to supply a drive current to the light source in accordance with the instruction value indicated by the image signal received by the processing unit,
   the driving unit including a shaping circuit and an adjusting unit,
   the shaping circuit including
      a plurality of D/A converters each configured to, in response to input of a digital signal, output an analog signal corresponding to a value of the digital signal, and
      an arithmetic unit configured to output the drive current to the light source based on a computation result of analog signals outputted from the plurality of D/A converters, and
   the adjusting unit being configured to determine values of digital signals inputted into the plurality of D/A converters of the shaping circuit in accordance with the instruction value.

2. The image display system according to claim 1, wherein
   the plurality of D/A converters each have a value of an analog signal linearly changing relative to a value of a digital signal.

3. The image display system according to claim 1, wherein
   the plurality of D/A converters include at least a first D/A converter and a second D/A converter which are different in amount of change in an analog signal relative to a value of a digital signal.

4. The image display system according to claim 3, wherein
   the adjusting unit is configured to divide a series of bits indicative of the instruction value into a series of lower bits including a least significant bit and a series of upper bits including a most significant bit, and is configured to provide a digital signal based on the series of lower bits to the first D/A converter and provide a digital signal based on the series of upper bits to the second D/A converter.

5. The image display system according to claim 3, wherein
   the adjusting unit is configured to provide a digital signal having a value changing in accordance with at least the instruction value to the first D/A converter when the instruction value falls within a first numerical range, and is configured to provide a digital signal having a fixed value to the first D/A converter and provide a digital signal having a value changing in accordance with at least the instruction value to the second D/A converter when the instruction value falls within a second numerical range of numerical values larger than those of the first numerical range.

6. The image display system according to claim 5, wherein
   the adjusting unit is configured to provide, to the first D/A converter, a digital signal allowing the first D/A converter to output an analog signal with a value of zero when the instruction value is equal to a lower limit value of the first numerical range.

7. The image display system according to claim 5, wherein
   the adjusting unit is configured to provide, to the first D/A converter, a digital signal allowing the first D/A converter to output an analog signal with a maximum value when the instruction value is equal to an upper limit value of the first numerical range.

8. The image display system according to claim 5, wherein
   a digital signal with the fixed value is a digital signal allowing the first D/A converter to output an analog signal with a maximum value.

9. The image display system according to claim 5, wherein
   the adjusting unit is configured to provide, to the second D/A converter, a digital signal allowing the second D/A converter to output an analog signal with a value of zero, when the instruction value is equal to a lower limit value of the second numerical range.

10. The image display system according to claim 5, wherein
    the adjusting unit is configured to provide, to the second D/A converter, a digital signal allowing the second D/A converter to output an analog signal with a maximum value when the instruction value is equal to an upper limit value of the second numerical range.

11. The image display system according to claim 3, wherein
    resolution of the first D/A converter is lower than resolution of the second D/A converter.

12. The image display system according to claim 1, wherein
    the shaping circuit includes a current source for supplying an offset current for the drive current.

13. The image display system according to claim 12, wherein the arithmetic unit is configured to generate the drive current by adding the offset current to the computation result of the analog signals outputted from the plurality of D/A converters.

14. The image display system according to claim 1, wherein
the light source includes a laser.

15. The image display system according to claim 1, further comprising a scanning unit configured to perform scanning with light from the light source,
wherein the processing unit is configured to control the scanning unit based on the image signal to form the image.

16. The image display system according to claim 1, wherein
the adjusting unit is configured to determine the values of the digital signals inputted into the plurality of D/A converters of the shaping circuit in accordance with the instruction value so that a relation between change in the luminance and change in the instruction value comes close to a linear relationship.

17. The image display system according to claim 1, wherein:
the luminaire includes a plurality of the light sources emitting light with mutually different wavelengths; and
the driving unit includes the shaping circuit for at least one of the plurality of light sources.

18. The image display system according to claim 1, wherein
the computation result is a sum of or a difference between the analog signals outputted from the plurality of D/A converters.

19. A movable object comprising:
the image display system according to claim 1; and
a body where the image display system is installed.

20. An image display method for forming an image by use of light from a light source of a luminaire, the method comprising:
receiving an image signal indicative of an instruction value of luminance of the light source;
determining values of digital signals inputted into a plurality of D/A converters in accordance with the instruction value; and
outputting the drive current to the light source based on a computation result of analog signals outputted from the plurality of D/A converters.

* * * * *